United States Patent [19]

Yoo

[11] Patent Number: 5,545,588
[45] Date of Patent: Aug. 13, 1996

[54] METHOD OF USING DISPOSABLE HARD MASK FOR GATE CRITICAL DIMENSION CONTROL

[75] Inventor: Chue-San Yoo, Ta-chi Tsneng, Taiwan

[73] Assignee: Taiwan Semiconductor Manufacturing Company, Hsin-chu, Taiwan

[21] Appl. No.: 435,189

[22] Filed: May 5, 1995

[51] Int. Cl.$^6$ ................................................. H01L 21/28
[52] U.S. Cl. ...................... 437/187; 437/193; 437/195; 437/228
[58] Field of Search ................................. 437/186, 187, 437/191, 192, 193, 195, 228, 231

[56] References Cited

U.S. PATENT DOCUMENTS

| | | | |
|---|---|---|---|
| 5,219,788 | 6/1993 | Abernathy et al. | 437/187 |
| 5,302,538 | 4/1994 | Ishikawa et al. | 437/193 |
| 5,324,689 | 6/1994 | Yoo | 437/228 |
| 5,350,486 | 9/1994 | Huang | 156/633 |
| 5,354,713 | 10/1994 | Kim et al. | 437/195 |

FOREIGN PATENT DOCUMENTS 5206125  8/1993  Japan .

Primary Examiner—George Fourson
Assistant Examiner—Thomas G. Bilodeau
Attorney, Agent, or Firm—George O. Saile; Rosemary L. S. Pike

[57] ABSTRACT

A new method of controlling the critical dimension width of polysilicon by using a disposable hard mask is described. A semiconductor substrate is provided wherein the surface of the substrate has an uneven topography. A layer of polysilicon is deposited over the uneven surface of the substrate. The polysilicon layer is covered with a spin-on-glass layer wherein the spin-on-glass material planarizes the surface of the underlying topography. A semiconductor layer is deposited over the surface of the planarization layer to act as a hard mask wherein the semiconductor layer is opaque to actinic light. The semiconductor layer is covered with a uniform thickness layer of photoresist. The photoresist layer is exposed to actinic light wherein the semiconductor layer prevents reflection of the actinic light from its surface. The photoresist layer is developed and patterned to form the desired photoresist mask for the polysilicon layer. The semiconductor layer, the spin-on-glass layer, and the polysilicon layer not covered by the photoresist mask are anisotropically etched away to form polysilicon gate electrodes and interconnection lines. The photoresist mask, the hard mask, and the spin-on-glass layer are removed to complete the formation of polysilicon gate electrodes and interconnection lines having uniform critical dimension in the fabrication of an integrated circuit.

45 Claims, 3 Drawing Sheets

METHOD OF USING DISPOSABLE HARD MASK FOR GATE CRITICAL DIMENSION CONTROL

BACKGROUND OF THE INVENTION (1) Field of the Invention

The invention relates to a method of controlling the critical dimension width of polysilicon, and more particularly, to a method of controlling the critical dimension width of polysilicon by using a disposable hard mask to eliminate critical dimension variation in the manufacture of integrated circuits.

(2) Description of the Prior Art

Referring to FIG. 1, there is shown a portion of a partially completed integrated circuit in which there is a silicon substrate 10. Field oxide regions 12 are formed in and on the silicon substrate resulting in a uneven topography of the top surface of the substrate. A gate oxide layer 14 is grown on the surface of the substrate and the field oxide regions. A layer of polysilicon 16 is deposited over the gate oxide layer. A layer of photoresist 18 covers the surface of the substrate and planarizes the substrate. The differing photoresist depths A and B will make an imperfect image and resulting mask, causing critical dimension variation. Due to the standing-wave phenomenon, different resist thicknesses result in different resist dimensions; this is known as the swing-effect. Also, the polysilicon on the sloped edge of the field oxide region reflects light 20 during photolithographic exposure, resulting in necking.

FIG. 2 shows the integrated circuit chip after photolithography and etching with completed polysilicon lines 16A, 16B, and 16C. FIG. 3 shows a top view of FIG. 2, including field oxide regions 12, active areas 22, and polysilicon lines 16A, 16B, and 16C. The mask used has the same dimensions for polysilicon lines 16A and 16B, but different dimensions are printed on the photoresist mask because of the different photoresist thicknesses on the topography. Resulting polysilicon line 16A has a different dimension than polysilicon line 16B because of the photoresist thickness difference (A and B in FIG. 1) due to different elevations. This figure also illustrates the necking problem 24 in polysilicon line 16C, especially for areas having a large change in topography such as the field oxide to active areas. This necking problem could result in early breakdown of the integrated circuit via the neck, 24.

U.S. Pat. No. 5,324,689 to Yoo uses spin-on-glass to planarize the photoresist underlayer to control critical dimension width. U.S. Pat. No. 5,354,713 to Kim et al uses spin-on-glass and etchback to flatten the insulating layer between metal lines. U.S. Pat. No. 5,350,486 to Huang uses spin-on-glass in a planarization process.

SUMMARY OF THE INVENTION

A principal object of the present invention is to provide an effective and very manufacturable method of providing a necking-free and uniform critical dimension width for polysilicon across an uneven topography.

Another object of the present invention is to provide a method of critical dimension control which will not impact or disturb the final device characteristics.

A further object of the present invention is to provide a method of critical dimension control using a disposable hard mask.

In accordance with the objects of this invention a new method of controlling the critical dimension width of polysilicon by using a disposable hard mask is achieved. A semiconductor substrate is provided wherein the surface of the substrate has an uneven topography. A layer of polysilicon is deposited over the uneven surface of the substrate. The polysilicon layer is covered with a spin-on-glass layer wherein the spin-on-glass material planarizes the surface of the underlying topography. A semiconductor layer is deposited over the surface of the planarization layer to act as a hard mask wherein the semiconductor layer is opaque to actinic light. The semiconductor layer is covered with a uniform thickness layer of photoresist. The photoresist layer is exposed to actinic light wherein the semiconductor layer prevents reflection of the actinic light from its surface. The photoresist layer is developed and patterned to form the desired photoresist mask for the polysilicon layer. The semiconductor layer, the spin-on-glass layer, and the polysilicon layer not covered by the photoresist mask are anisotropically etched away to form polysilicon gate electrodes and interconnection lines. The photoresist mask, the hard mask, and the spin-on-glass layer are removed to complete the formation of polysilicon gate electrodes and interconnection lines having uniform critical dimension in the fabrication of an integrated circuit.

BRIEF DESCRIPTION OF THE DRAWINGS

In the accompanying drawings forming a material part of this description, there is shown.

DESCRIPTION OF THE PREFERRED EMBODIMENTS

Figure 4:
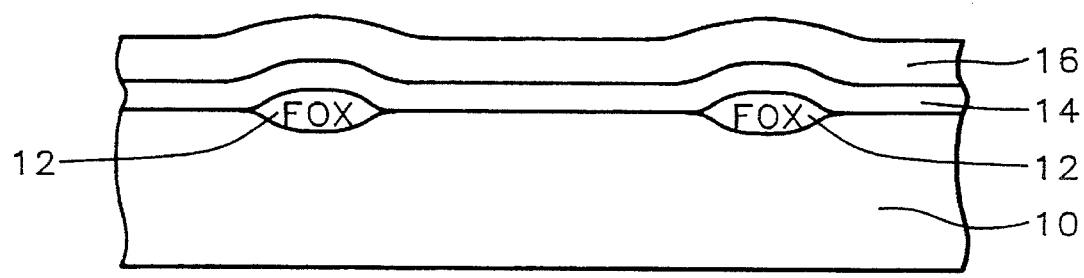
FIG. 4 schematically illustrates in cross-sectional representation a preferred embodiment of the present invention.

Referring now more particularly to FIGS. 4–8, the process of the present invention will be described. A portion of a partially completed integrated circuit is illustrated in FIG. 4 consisting of a semiconductor substrate 10, preferably composed of monocrystalline silicon. Field oxide regions 12 have been formed as is conventional in the art in the semiconductor substrate 10 resulting in an uneven topography of the surface of the substrate.

A layer of gate silicon oxide 14 is grown over the surface of the semiconductor substrate and the field oxide regions to a thickness of between about 50 to 200 Angstroms. A layer 16 of polysilicon or polycide is deposited over the uneven surface of the substrate to a thickness of, for example between about 2000 to 5000 Angstroms.

Figure 5A:
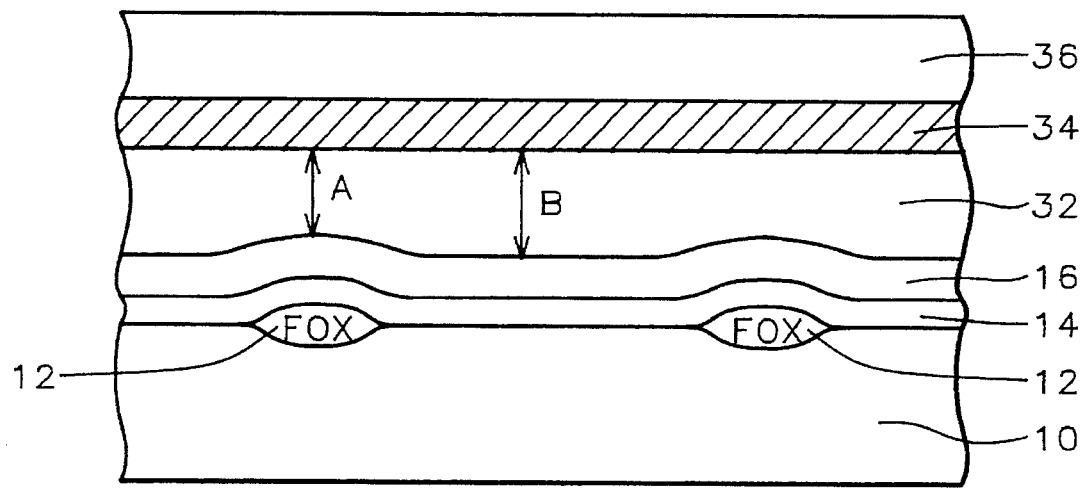
FIGS. 5A and 5B schematically illustrate in cross-sectional representation two alternatives in a preferred embodiment of the present invention.

Next, referring to FIG. 5A, a spin-on-glass material 32, either a silicate or a siloxane, is deposited over the polysilicon or polycide layer 16. The spin-on-glass material suspended in the vehicle or solvent is deposited onto the semiconductor wafer surface and uniformly spread thereover by the action of spinning the wafer, for example, at 3500 revolutions per minute. The spin-on-glass material fills in the indentations and smooths the integrated circuit wafer surface. The spin-on-glass layer may be between about 1500 Angstroms thick at A to 4000 Angstroms thick at B. The spin-on-glass material is now baked at a temperature of between about 200° to 420° C. for between about 15 to 40 minutes to remove the solvent and fix the layer. This baking step also sufficiently cures the spin-on-glass layer 32.

Alternatively, the planarizing layer 32 may be any other dielectric that can be planarized such as phosphosilicate glass (PSG), borophosphosilicate glass (BPSG), or a combination of BPSG and tetraethoxysilane (TEOS), or the like. These dielectrics may be deposited by chemical vapor deposition (CVD) or plasma-enhanced CVD to a thickness of between about 1500 to 4000 Angstroms. Then the dielectric is subjected to a high temperature to reflow the glass and to planarize the top surface of the semiconductor substrate.

Next, the disposable hard mask of the present invention is formed. A semiconductor layer of titanium or titanium nitride or amorphous silicon 34 is sputter deposited over the planarized surface of the substrate to a thickness of between about 100 to 400 Angstroms to form a hard mask. The hard semiconductor mask is opaque to the actinic light used in photolithography so that light will not be reflected from it as it is reflected from the polysilicon or polycide layer around a slope in the prior art. This will avoid the necking problem.

Figure 5B:
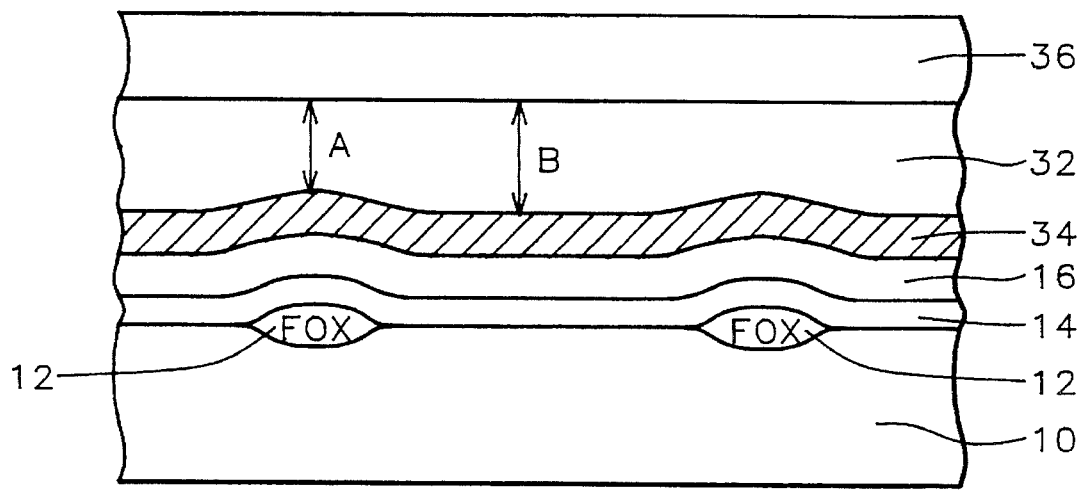

Referring now to FIG. 5B, an alternative process flow will be described. The disposable hard mask may be formed directly overlying the polysilicon or polycide layer 16. A semiconductor layer of titanium or titanium nitride or amorphous silicon 34 is sputter deposited over the layer 16 to a thickness of between about 100 to 400 Angstroms. Next, the planarizing layer 32 composed of spin-on-glass or other dielectric, as described above, is coated overlying the semiconductor layer 34. A photoresist layer 36 is coated over the planarizing layer 32 and processing continues as described below with reference again to FIG. 5A.

Figure 1:
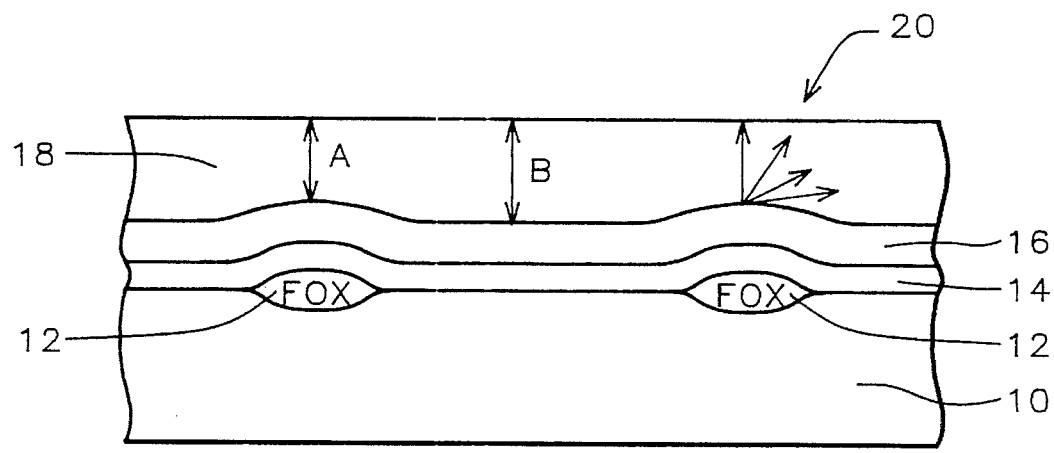
FIGS. 1 and 2 schematically illustrate in cross-sectional representation a process of the prior art.
Figure 2:
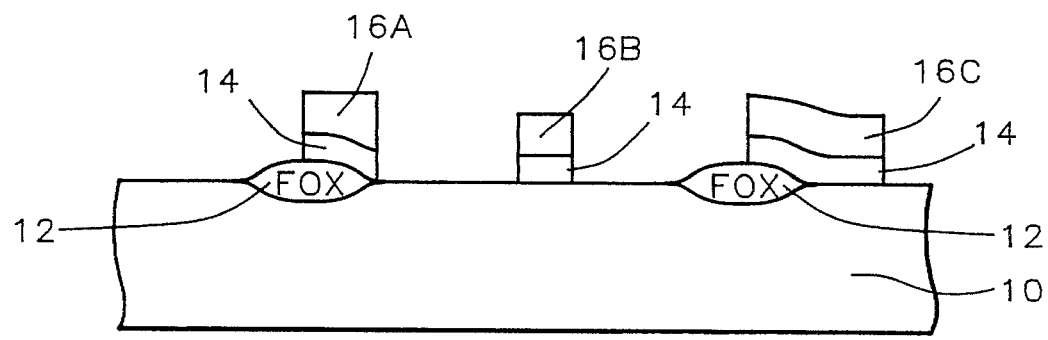

A layer of photoresist 36 is coated onto the hard semiconductor mask 34 to a thickness of between about 0.7 to 1.5 micrometers. The critical dimension problem is avoided because the photoresist layer has a constant thickness since the substrate has been planarized by the spin-on-glass layer. The different thicknesses A and B are within the spin-on-glass coating rather than within the photoresist as in the prior art (FIG. 1). The photoresist is exposed, developed and etched to form the pattern mask.

Figure 6:
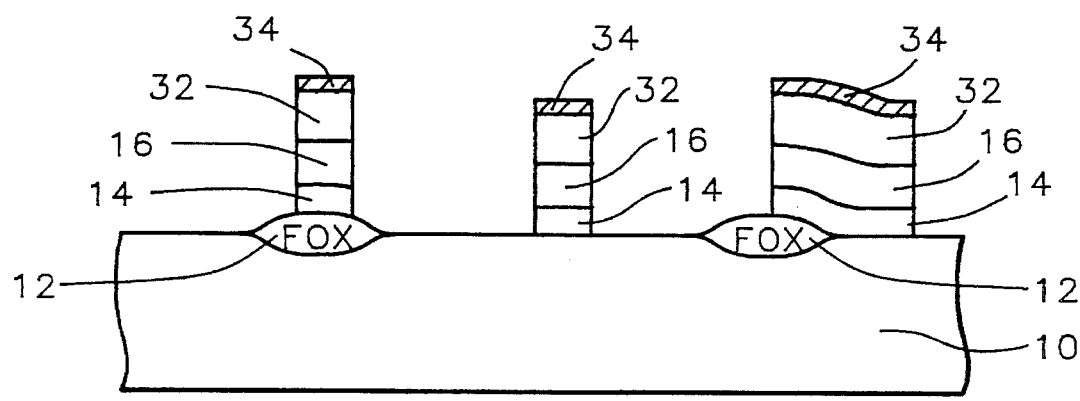
FIGS. 6 and 7 schematically illustrate in cross-sectional representation a preferred embodiment of the present invention.

The hard mask layer 34, planarizing layer 32, polysilicon or polycide layer 16, and gate silicon oxide layer 14 are etched away where not covered by the photoresist mask resulting in the stacks illustrated in FIG. 6. For example, titanium can be etched with plasma or a wet etching solution. It is preferred to etch the spin-on-glass material with a plasma; for example, a fluorine-based plasma. The gate oxide layer acts as an etch stop for the polysilicon or polycide gate etch.

The photoresist mask is stripped using conventional methods such as oxygen ashing. The hard mask 34 is stripped using, for example, a solution of ammonia and hydrogen peroxide ($NH_4OH + H_2O_2$) with an etch rate of between about 300 to 900 Angstroms per minute. The remaining spin-on-glass layer 32 is stripped using a hydrofluoric acid dip at an etch rate of between about 1000 to 3000 Angstroms per minute. For the alternative planarization materials, the stripper used may be a hydrofluoric acid or buffered oxide etch (BOE) solution with an etch rate of between about 1000 to 3000 Angstroms per minute.

Figure 3:
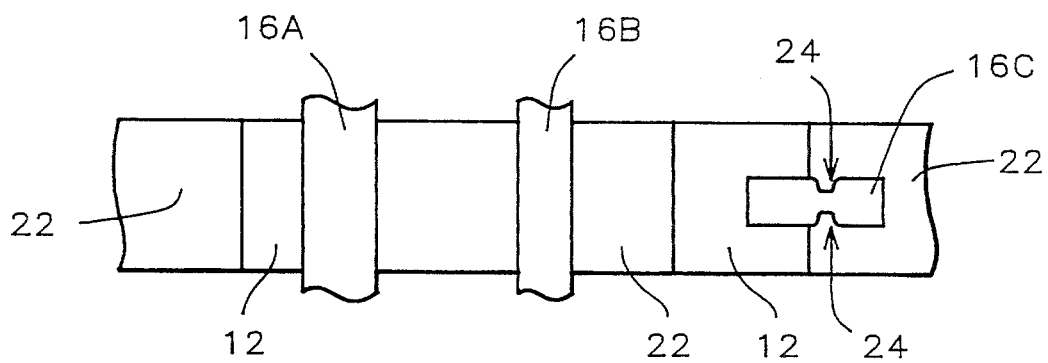
FIG. 3 schematically illustrates in top-view representation some drawbacks of the prior art process.
Figure 7:
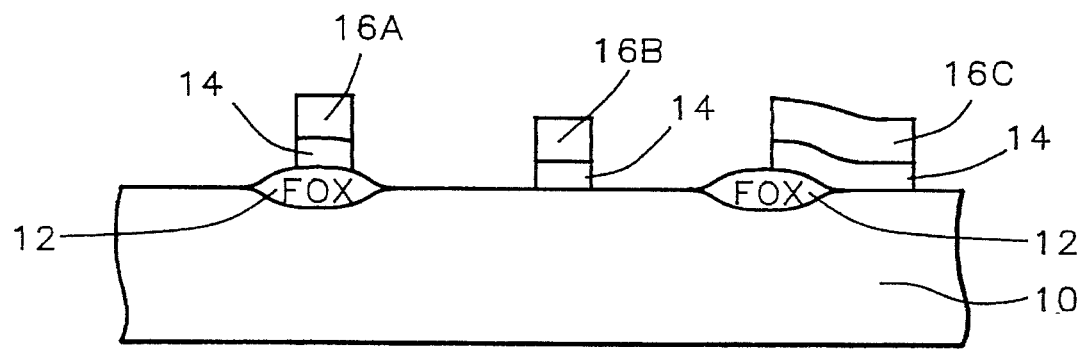
Figure 8:
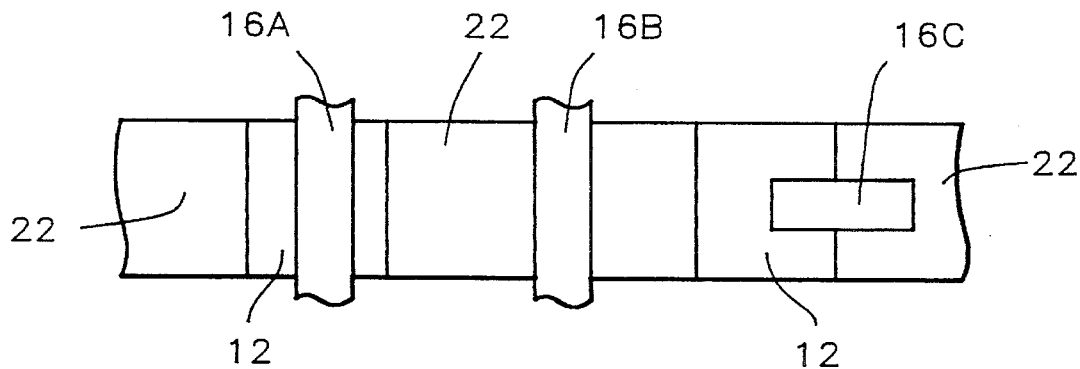
FIG. 8 schematically illustrates in top-view representation a preferred embodiment of the present invention.

FIG. 7 illustrates the polysilicon lines 16A, 16B, and 16C formed by the process of the invention. FIG. 8 shows a top view of FIG. 7, including field oxide regions 12, active areas 22, and polysilicon lines 16A, 16B, and 16C. With the novel process of the present invention, polysilicon lines 16A and 16B have the same width; that is, there is uniform polysilicon critical dimension because the height differences A and B in FIG. 5 occur within the planarizing layer rather than within the photoresist layer. This figure also shows that the necking problem (24 in FIG. 3) does not occur in polysilicon line 16C because of the anti-reflective property of the disposable hard mask.

The process of the present invention results in a uniform circuit critical dimension and the absence of the polysilicon necking problem. The planarization layer and the hard mask are easy to apply and easy to remove. The hard mask may be placed overlying the planarizing layer, as shown in FIG. 5A, or underneath the planarizing layer, as shown in FIG. 5B for achieving the same extent of critical dimension control.

EXAMPLE

The following Example is given to show the important features of the invention and to aid in the understanding thereof. Variations may be made by one skilled in the art without departing from the spirit and scope of the invention.

TABLE 1

| Process | Conventional | ARC | Invention |
| --- | --- | --- | --- |
| Exposure Energy | 185 mj, −.3 | 195 mj, 0 | 185 mj, 0 |
| TL (0.6) | .620/8 | .640/10 | .602/14 |
| PCD(0.58) | .523/12 | .546/12 | .614/14 |
| CCD-1(0.5) | .519/21 | .466/14 | .555/16 |
| CCD-2 | .471/15 | .491/14 | .542/13 |
| CCD-3 | .458/16 | .477/10 | .556/22 |
| TL-PCD (um) | 0.097 | 0.094 | −0.012 |
| TL-0.1-CCD | 0.062 | 0.074 | −0.054 |
| CCD-CCD | 0.061 | 0.025 | 0.014 |

In experiments, the inventors tested the polysilicon dimension variation using three different processes: the conventional process using photoresist only, the ARC process using an antireflective coating, and the process of the Invention. The stepper exposure energy and focus offset are indicated on the second row for each process. TL is the test line dimension, PCD is the peripheral dimension, and CCD-1 through 3 represent the dimensions at three different locations in the cell array. The numbers in parentheses indicates the dimensions on the mask. TL–PCD indicates the difference between TL and PCD. TL–0.1–CCD is the difference between TL and CCD, compensating for the mask dimension difference of 0.1. CCD–CCD is the difference between two cell critical dimensions.

It can be seen from Table 1 that while the ARC process reduces the serious necking and polysilicon dimension variation to some extent, the process of the invention yields the best dimension uniformity.

While the invention has been particularly shown and described with reference to the preferred embodiments thereof, it will be understood by those skilled in the art that various changes in form and details may be made without departing from the spirit and scope of the invention.

What is claimed is:

1. A method of providing a uniform critical dimension of gate electrodes and interconnection lines during photoetching in the fabrication of an integrated circuit comprising:

providing field oxide isolation areas surrounding bare active areas in and on a semiconductor substrate wherein the surface of said substrate has an uneven topography;

growing a gate silicon oxide layer on the surface of said field oxide areas and said active areas of said semiconductor substrate;

depositing a conducting layer over said gate silicon oxide layer;

covering said conducting layer with a planarization layer wherein said planarization layer planarizes the surface of said substrate;

depositing an anti-reflection layer over the surface of said planarization layer wherein said anti-reflection layer forms a hard mask which is opaque to actinic light;

covering said hard mask with a uniform thickness layer of photoresist;

exposing said photoresist layer to actinic light wherein said hard mask prevents reflection of said actinic light from its surface and developing and patterning said photoresist layer to form a photoresist mask for said conducting layer;

anisotropically etching away said hard mask, said planarization layer, and said conducting layer not covered by said photoresist mask to form said gate electrodes and interconnection lines wherein the width of said gate electrodes and interconnection lines is said critical dimension; and removing said photoresist mask, remaining said hard mask, and remaining said planarization layer to complete the formation of said gate electrodes and interconnection lines having said uniform critical dimension in the fabrication of said integrated circuit.

2. A method according to claim 1 wherein said uneven topography has a vertical height difference of between about 1000 and 4000 Angstroms.

3. A method according to claim 1 wherein said conducting layer comprises polysilicon having a thickness of between about 2000 and 4000 Angstroms.

4. A method according to claim 1 wherein said conducting layer comprises polycide having a thickness of between about 2000 and 4000 Angstroms.

5. A method according to claim 1 wherein said planarization layer comprises spin-on-glass coated to a thickness of between about 1000 and 4000 Angstroms.

6. A method according to claim 5 wherein said spin-on-glass material is a silicate.

7. A method according to claim 5 wherein said spin-on-glass material is a siloxane.

8. A method according to claim 5 wherein said spin-on-glass layer is baked at between about 200° and 420° C. for between about 15 and 40 minutes.

9. A method according to claim 1 wherein said planarization layer comprises phosphosilicate glass deposited to a thickness of between about 1000 and 4000 Angstroms and wherein said planarization layer is reflowed.

10. A method according to claim 1 wherein said planarization layer comprises borophosphosilicate glass deposited to a thickness of between about 1000 and 4000 Angstroms and wherein said planarization layer is reflowed.

11. A method according to claim 1 wherein said planarization layer comprises a double layer of borophosphosilicate glass deposited to a thickness of between about 1000 and 4000 Angstroms and tetraethoxysilane deposited to a thickness of between about 1000 and 4000 Angstroms and wherein said double layer is reflowed.

12. A method according to claim 1 wherein said anti-reflection layer comprises titanium nitride sputter deposited to a thickness of between about 100 and 400 Angstroms.

13. A method according to claim 1 wherein said anti-reflection layer comprises amorphous silicon sputter deposited to a thickness of between about 100 and 400 Angstroms.

14. A method according to claim 1 wherein remaining said hard mask is removed by a solution of ammonium and hydrogen peroxide.

15. A method according to claim 5 wherein remaining said planarization layer is removed by a hydrofluoric acid solution.

16. A method according to claim 9 wherein remaining said planarization layer is removed by a hydrofluoric acid solution.

17. A method according to claim 9 wherein remaining said planarization layer is removed by plasma etching.

18. A method according to claim 10 wherein remaining said planarization layer is removed by a hydrofluoric acid solution.

19. A method according to claim 10 wherein remaining said planarization layer is removed by plasma etching.

20. A method according to claim 11 wherein remaining said planarization layer is removed by a hydrofluoric acid solution.

21. A method according to claim 11 wherein remaining said planarization layer is removed by plasma etching.

22. A method of providing a uniform critical dimension of gate electrodes and interconnection lines during photoetching in the fabrication of an integrated circuit comprising:

providing field oxide isolation areas surrounding bare active areas in and on a semiconductor substrate wherein the surface of said substrate has an uneven topography;

growing a gate silicon oxide layer on the surface of said field oxide areas and said active areas of said semiconductor substrate;

depositing a conducting layer over said gate silicon oxide layer;

depositing an anti-reflection layer over the surface of said conducting layer wherein said anti-reflection layer forms a hard mask which is opaque to actinic light;

covering said hard mask with a planarization layer wherein said planarization layer planarizes the surface of said substrate;

covering said planarization layer with a uniform thickness layer of photoresist;

exposing said photoresist layer to actinic light wherein said hard mask prevents reflection of said actinic light from its surface and developing and patterning said photoresist layer to form a photoresist mask for said conducting layer;

anisotropically etching away said planarization layer, said hard mask, and said conducting layer not covered by said photoresist mask to form said gate electrodes and interconnection lines wherein the width of said gate electrodes and interconnection lines is said critical dimension; and removing said photoresist mask, remaining said planarization layer, and remaining said hard mask to complete the formation of said gate electrodes and interconnection lines having said uniform critical dimension in the fabrication of said integrated circuit.

23. A method according to claim 22 wherein said uneven topography has a vertical height difference of between about 1000 and 4000 Angstroms.

24. A method according to claim 22 wherein said conducting layer comprises polysilicon having a thickness of between about 2000 and 4000 Angstroms.

25. A method according to claim 22 wherein said conducting layer comprises polycide having a thickness of between about 2000 and 4000 Angstroms.

26. A method according to claim 22 wherein said planarization layer comprises spin-on-glass coated to a thickness of between about 1000 and 4000 Angstroms.

27. A method according to claim 26 wherein said spin-on-glass layer is baked at between about 200° and 420° C. for between about 15 and 40 minutes.

28. A method according to claim 22 wherein said planarization layer comprises phosphosilicate glass deposited to a thickness of between about 1000 and 4000 Angstroms and wherein said planarization layer is reflowed.

29. A method according to claim 22 wherein said planarization layer comprises borophosphosilicate glass deposited to a thickness of between about 1000 and 4000 Angstroms and wherein said planarization layer is reflowed.

30. A method according to claim 22 wherein said planarization layer comprises a double layer of borophosphosilicate glass deposited to a thickness of between about 1000 and 4000 Angstroms and tetraethoxysilane deposited to a thickness of between about 1000 and 4000 Angstroms and wherein said double layer is reflowed.

31. A method according to claim 22 wherein said antireflection layer comprises titanium nitride sputter deposited to a thickness of between about 100 and 400 Angstroms.

32. A method according to claim 22 wherein said antireflection layer comprises amorphous silicon sputter deposited to a thickness of between about 100 and 400 Angstroms.

33. A method according to claim 22 wherein remaining said hard mask is removed by a solution of ammonium and hydrogen peroxide.

34. A method of providing a uniform critical dimension of gate electrodes and interconnection lines during etching in the fabrication of an integrated circuit comprising:

providing field oxide isolation areas surrounding bare active areas in and on a semiconductor substrate wherein the surface of said substrate has an uneven topography;

growing a gate silicon oxide layer on the surface of said field oxide areas and said active areas of said semiconductor substrate;

depositing a conducting layer over said gate silicon oxide layer;

covering said conducting layer with a spin-on-glass layer wherein said spin-on-glass layer planarizes the surface of said substrate;

depositing a titanium layer over the surface of said spin-on-glass layer wherein said titanium layer is opaque to actinic light;

covering said titanium layer with a uniform thickness layer of photoresist;

exposing said photoresist layer to actinic light wherein said titanium layer prevents reflection of said actinic light from its surface and developing and patterning said photoresist layer to form a photoresist mask for said conducting layer;

anisotropically etching away said titanium layer, said spin-on-glass layer, and said conducting layer not covered by said photoresist mask to form said gate electrodes and interconnection lines wherein the width of said gate electrodes and interconnection lines is said critical dimension; and removing said photoresist mask, remaining said titanium layer, and remaining said spin-on-glass layer to complete the formation of said gate electrodes and interconnection lines having said uniform critical dimension in the fabrication of said integrated circuit.

35. A method according to claim 34 wherein said uneven topography has a vertical height difference of between about 1000 and 4000 Angstroms.

36. A method according to claim 34 wherein said conducting layer comprises polysilicon having a thickness of between about 2000 and 4000 Angstroms.

37. A method according to claim 34 wherein said conducting layer comprises polycide having a thickness of between about 2000 and 4000 Angstroms.

38. A method according to claim 34 wherein said spin-on-glass material is a silicate coated to a thickness of between about 1000 and 4000 Angstroms.

39. A method according to claim 34 wherein said spin-on-glass material is a siloxane coated to a thickness of between about 1000 and 4000 Angstroms.

40. A method according to claim 34 wherein said spin-on-glass layer is baked at between about 200° and 420° C. for between about 15 and 40 minutes.

41. A method according to claim 34 wherein said titanium layer is sputter deposited to a thickness of between about 100 and 400 Angstroms.

42. A method according to claim 34 wherein remaining said titanium layer is removed by a solution of ammonium and hydrogen peroxide.

43. A method according to claim 34 wherein remaining said spin-on-glass layer is removed by a hydrofluoric acid solution.

44. A method according to claim 1 wherein said antireflection layer comprises titanium sputter deposited to a thickness of between about 100 and 400 Angstroms.

45. A method according to claim 22 wherein said planarization layer comprises a double layer of borophosphosilicate glass deposited to a thickness of between about 1000 and 4000 Angstroms and silicon oxide deposited to a thickness of between about 1000 and 4000 Angstroms and wherein said double layer is reflowed.

* * * * *